(12) United States Patent
Kim et al.

(10) Patent No.: US 11,600,685 B2
(45) Date of Patent: Mar. 7, 2023

(54) DISPLAY PANEL AND DISPLAY DEVICE USING SAME

(71) Applicant: LG Display Co., Ltd., Seoul (KR)

(72) Inventors: Hyundong Kim, Paju-si (KR);
Kyungmin Kim, Paju-si (KR);
Youngin Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 137 days.

(21) Appl. No.: 17/139,277

(22) Filed: Dec. 31, 2020

(65) Prior Publication Data

US 2021/0202677 A1 Jul. 1, 2021

(30) Foreign Application Priority Data

Dec. 31, 2019 (KR) .................. 10-2019-0179622

(51) Int. Cl.
*H01L 27/32* (2006.01)
*G09G 3/3291* (2016.01)

(52) U.S. Cl.
CPC ....... *H01L 27/3276* (2013.01); *G09G 3/3291* (2013.01); *H01L 27/3246* (2013.01); *G09G 2310/0286* (2013.01)

(58) Field of Classification Search
CPC ............ H01L 27/3244; H01L 27/3246; H01L 27/3276; H01L 27/32–3293; H01L 51/5203; G09G 3/3233; G09G 3/3255; G09G 3/3266; G09G 2300/0408; G09G 2300/0421; G09G 2300/0426; G09G 2310/0286; G09G 3/2074; G09G 3/32–3291; G09G 3/3655; G09G 2300/0439–0465; G09G 2300/0809–0871; G09G 3/007; G09G 3/3225; G11C 19/28–287
See application file for complete search history.

(56) References Cited

U.S. PATENT DOCUMENTS

| 2016/0190228 A1* | 6/2016 | Park | H01L 27/3276 257/40 |
| 2016/0267831 A1* | 9/2016 | Seo | G09G 3/2085 |
| 2018/0138256 A1* | 5/2018 | Han | H01L 51/5237 |
| 2018/0166015 A1* | 6/2018 | Beak | H01L 27/1288 |

* cited by examiner

*Primary Examiner* — Amr A Awad
*Assistant Examiner* — Aaron Midkiff
(74) *Attorney, Agent, or Firm* — Morgan, Lewis & Bockius LLP

(57) ABSTRACT

A display panel includes an active area including pixels arranged along a first direction and a second direction intersecting each other and data lines and gate lines arranged to be intersected; and shift registers supplying a gate pulse to each of the gate lines, wherein each of the shift registers includes GIP circuit portions dispersedly disposed in the active area; and GIP lines supplying a predetermined signal to the GIP circuit portions or connecting the GIP circuit portions with each other, the GIP lines being located between neighboring pixels along the second direction.

9 Claims, 12 Drawing Sheets

DISPLAY PANEL AND DISPLAY DEVICE USING SAME

CROSS REFERENCE TO RELATED APPLICATIONS

The application claims the benefit of Korean Patent Application No. 10-2019-0179622 filed on Dec. 31, 2019, the entire contents of which is incorporated herein by reference for all purposed as if fully set forth herein.

BACKGROUND

Technical Field

The present disclosure relates generally to a display panel and a display device using the same, the display panel having a shift register of a gate driving circuit arranged in a pixel array.

Discussion of the Related Art

A display device includes a liquid crystal display device (LCD), a field emission display (FED), a plasma display panel (PDP), and an electroluminescence display, and the like. As an example of the electroluminescence device, there is an active matrix type organic light emitting display device (hereinafter, referred to as "OLED display device")

The driving circuit of such a display device includes a data driving circuit that supplies data voltages to data lines, a gate driving circuit that sequentially supplies gate pulses (or scan pulses) to gate lines (or scan lines), and the like. A shift register of the gate driving circuit can be formed directly on the same substrate together with a thin film transistor (TFT) array of an active area constituting the screen. Hereinafter, the gate driving circuit formed directly on a substrate of the display panel will be referred to as a "GIP (Gate In Panel) circuit". The GIP circuit includes a shift register in which stages sequentially generating output voltages are cascade-connected.

The GIP circuit receives a start pulse or a carry signal received from a previous stage as the start pulse and generates an output when a clock is input. The output terminal of each of the stages is connected to a gate line of the display panel, and supplies a scan pulse synchronized with the data voltage to the gate line.

The GIP circuit is disposed in a bezel area outside the active area. Herein, since an increase in the bezel area is inevitable due to the GIP circuit, it is difficult to implement a display device having an extreme-narrow bezel or a zero bezel.

SUMMARY

Accordingly, embodiments of the present disclosure are directed to a display panel and a display device using the same that substantially obviate one or more of the problems due to limitations and disadvantages of the related art.

An aspect of this disclosure is to provide a display panel and a display device using the same, in which a shift register of a gate driving circuit is arranged in a pixel array to implement an extreme-narrow bezel or a zero bezel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display panel comprises an active area including pixels arranged along a first direction and a second direction intersecting each other and data lines and gate lines arranged to be intersected; and shift registers supplying a gate pulse to each of the gate lines, wherein each of the shift registers includes GIP circuit portions dispersedly disposed in the active area; and GIP lines supplying a predetermined signal to the GIP circuit portions or connecting the GIP circuit portions with each other, the GIP lines being located between neighboring pixels along the second direction.

The active area may include a plurality of pixels arranged along the first direction and a plurality of pixel lines sequentially defined along the second direction; and the GIP lines may be located between a $(2n-1)$-th pixel line and a $2n$-th pixel line, wherein n is a natural number greater than or equal to one.

The display panel may include a substrate; TFTs disposed on the substrate; an interlayer insulating film covering the TFTs; a planarization film covering the interlayer insulating film; an anode located on the planarization film and electrically connected to the corresponding TFT; a bank layer having an opening exposing at least a part of the anode; an organic compound layer located on the opening; and a cathode located on the organic compound layer, wherein at least one of the planarization layer and the bank layer is removed at one end and the other end in the second direction of the active area to form an open portion.

The GIP line may be not located in the open portion.

The GIP lines may include $(2n-1)$-th GIP lines and $2n$-th GIP lines sequentially arranged along the second direction between the $(2n-1)$-th pixel line and the $2n$-th pixel line that are neighboring along the second direction; the $(2n-1)$-th GIP lines may be connected to GIP circuit portions disposed in the $(2n-1)$-th pixel line; the $2n$-th GIP lines may be connected to GIP circuit portions disposed in the $2n$-th pixel line; and the $(2n-1)$-th GIP lines and the $2n$-th GIP lines may be symmetrically arranged with respect to a virtual reference line extending in the first direction between the $(2n-1)$-th pixel line and the $2n$-th pixel line that are neighboring.

The GIP lines may include a 1-1 GIP line, a 1-2 GIP line, a 2-2 GIP line and a 2-1 GIP line sequentially arranged along the second direction between the $(2n-1)$-th pixel line and the $2n$-th pixel line that are neighboring; the 1-1 GIP line and the 1-2 GIP line may be connected to GIP circuit portions disposed in the $(2n-1)$-th pixel line; the 2-2 GIP line and the 2-1 GIP line may be connected to GIP circuit portions disposed in the $2n$-th pixel line; a same type of signal may be applied to the 1-1 GIP line and the 2-1 GIP line; and a same type of signal may be applied to the 1-2 GIP line and the 2-2 GIP line.

The signal applied to the 1-1 GIP line and the 2-1 GIP line may be one of a clock and a power supply voltage; and the signal applied to the 1-2 GIP line and the 2-2 GIP line may be the other of the clock and the power supply voltage.

The pixels may include sub-pixels each including a light emitting element having an anode, a cathode, and an organic compound layer located between the anode and the cathode; the active area may include an EVSS contact portion connecting the cathode and an EVSS line supplying a low potential pixel reference voltage to the cathode; and the EVSS contact portion may be selectively located between the 2n-th pixel line and the (2n+1)-th pixel line that are neighboring.

The EVSS contact portion may include at least one insulating layer interposed between the EVSS line and the cathode; and an EVSS contact hole passing through the at least one insulating layer to connect the EVSS line and the cathode.

In another aspect, a display device comprises a display panel including an active area including pixels arranged along a first direction and a second direction intersecting each other and data lines and gate lines arranged to be intersected; and a data driving circuit supplying data voltages to the data lines; and a gate driving circuit sequentially supplying gate pulses to the gate lines, wherein the gate driving circuit includes shift registers that supply a gate pulse to the gate lines; and each of the shift registers includes GIP circuit portions dispersedly distributed in the active area; and GIP lines supplying a predetermined signal to the GIP circuit portions or connecting the GIP circuit portions to each other, the GIP lines being selectively located only between neighboring pixels along the second direction.

According to the present disclosure, the GIP circuit portions are dispersedly distributed in an active area of a display panel, and the GIP lines are selectively located only between neighboring pixels in the active area, thereby implementing an extreme-narrow bezel and a zero bezel.

According to the present disclosure, the organic film located on the outer periphery of the display panel is removed, thereby blocking a penetration path of moisture flowing in from the outside. Accordingly, degradation of the light emitting element due to moisture can be prevented. In addition, the present disclosure has an advantage of minimizing signal interference between the cathode and the GIP line, which is capable of occurring, as the organic layer is removed through the new arrangement of the GIP circuit, thereby reducing image quality defects.

It is to be understood that both the foregoing general description and the following detailed description are exemplary and explanatory and are intended to provide further explanation of the inventive concepts as claimed

BRIEF DESCRIPTION OF THE DRAWINGS

The accompanying drawings, which are included to provide a further understanding of the disclosure and are incorporated in and constitute a part of this application, illustrate embodiments of the disclosure and, together with the description, serve to explain principles of the disclosure. In the drawings.

DETAILED DESCRIPTION

Figure 1:
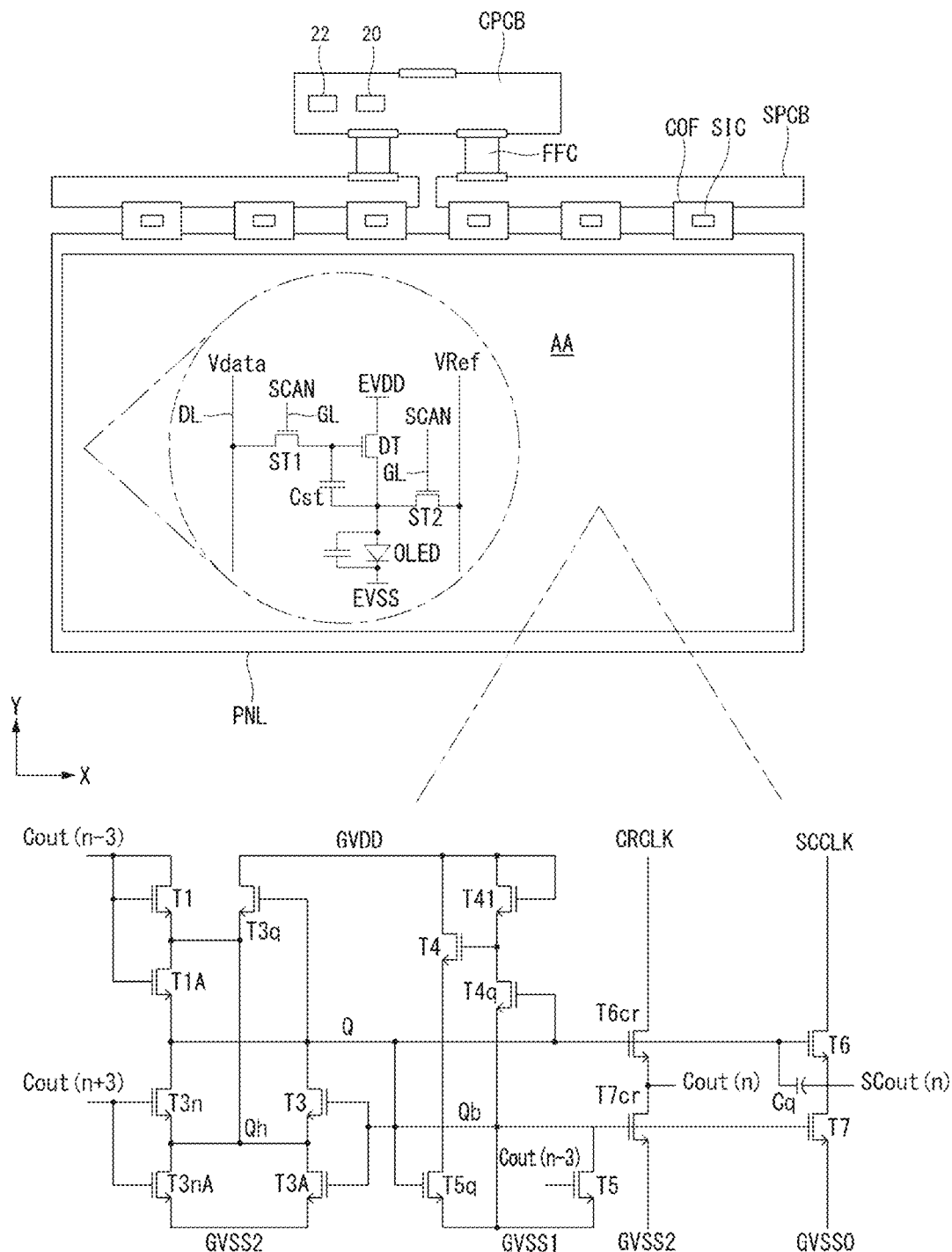
FIG. 1 is a block diagram schematically illustrating an electroluminescent display device according to an embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to provide a complete disclosure of the present disclosure and to fully provide a person having ordinary skill in the art to which the present disclosure pertains with the scope of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present disclosure. Further, in the following description, a detailed explanation of known related technologies may be omitted to avoid unnecessarily obscuring the subject matter of the present disclosure.

The terms such as "including", "having", and "consist of" used herein are generally intended to allow other components to be added unless the terms are used with the term "only". Any references to the singular may include the plural unless expressly stated otherwise.

Components are interpreted to include an ordinary error range even if not expressly stated.

When the position relation between two components is described using the terms such as "on", "above", "below", and "next", one or more components may be located between the two components unless the term such as "immediately" or "directly" is not used.

Although "the first", "the second", and the like may be used to distinguish the components, functions or structures of these components are not limited by the ordinal number or the name of the component before the component.

The following embodiments may be partially or totally coupled or combined with each other, and may be inter-operated with each other and driven technically in a various manners. Each of the embodiments may be implemented independently from each other or may be implemented together in co-dependent relationship.

A GIP circuit and a pixel circuit according to the present disclosure may be implemented with a TFT having a structure of an n-type or p-type metal oxide semiconductor field effect transistor (MOSFET). It should be noted that although an n-type TFT is illustrated in the following examples, the present disclosure is not limited thereto. The TFT is a three-electrode element, including a gate, a source, and a drain. The source is an electrode through which carriers are supplied with the transistor. In the TFT, the carriers begin to flow from the source. The drain is an electrode through which carriers move out of the TFT. That is, in the MOSFET, the carriers flow from source to drain. In the case of an n-type MOSFET (NMOS), since the carrier is an electron, the source voltage has a voltage lower than the drain voltage so that the electron may flow from source to drain. In the n-type MOSFET, since electrons flow from source to drain, the current flows from drain to source. In the case of a p-type TFT (PMOS), since the carrier is a hole, the source voltage is higher than the drain voltage so that the hole may flow from source to drain. In the p-type TFT (PMOS), since the holes flow from source to drain, the current flows from source to drain. It should be noted that the source and drain of the MOSFET are not fixed. For example, the source and drain of the MOSFET may be changed according to the applied voltage. In the following embodiments, transistors constituting the GIP circuit and the pixel circuit are illustrated as n-type TFTs, but are not limited thereto. Therefore, in the following description, the invention should not be limited due to the source and drain of the TFT.

A gate pulse output from the GIP circuit swings between a gate-on voltage (gate high voltage, VGH) and a gate-off voltage (gate low voltage, VGL). The gate-on voltage (VGH) is set to a voltage higher than the TFT's threshold voltage, and the gate-off voltage (VGL) is set to a voltage lower than the TFT's threshold voltage. In the case of an n-type TFT, the gate-on voltage may be a gate high voltage (VGH), and the gate-off voltage may be a gate low voltage (VGL). In the case of a p-type TFT, the gate-on voltage may be a gate low voltage (VGL), and the gate-off voltage may be a gate high voltage (VGH).

Figure 2:
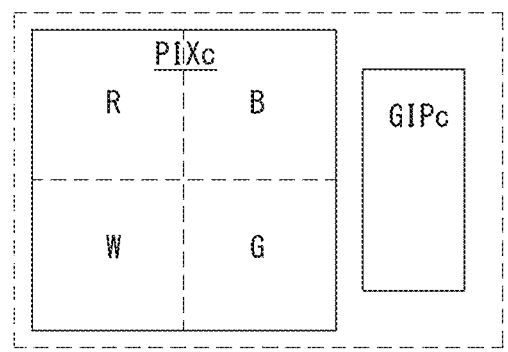
FIG. 2 is a plan view schematically illustrating one pixel.

FIG. 1 is a block diagram schematically illustrating an electroluminescent display device according to an embodiment of the present disclosure; and FIG. 2 is a plan view schematically illustrating one pixel.

Referring to FIGS. 1 and 2, the electroluminescent display device of the present disclosure includes a display panel PNL and a display panel driving circuit for writing input image data into the display panel PNL.

The display panel PNL of the present disclosure includes pixels PIXs arranged in a matrix along a first direction (e.g., X-axis direction) and a second direction (e.g., Y-axis direction) that intersect each other. The display panel PNL includes an active area AA that implements an input image, and data lines DL and gate lines GLs are intersected in the active area AA, to supply a gate pulse and a data voltage corresponding to each pixel PIX. Touch sensors may be further disposed in the active area AA of the display panel PNL.

The pixels PIXs each may include red (R), green (G), and blue (B) subpixels for color realization. Each of the pixels may further include a white (W) subpixel in addition to the RGB subpixels. Hereinafter, for convenience of description, a case where each of the pixels PIXs includes the first to fourth sub-pixels will be described as an example. The first to fourth sub-pixels may be red (R), green (G), blue (B), and white (W) sub-pixels, respectively, but are not limited thereto. Sub-pixels arranged in one pixel may be arranged in a quad type as illustrated, but are not limited thereto.

At least some of the pixels PIXs include a part of the GIP circuit. The GIP circuit is dispersedly disposed in the active area AA.

At least one of the pixels may be divided into a circuit portion PIXc for driving the light emitting element in the pixel and a circuit portion GIPc including a part of the GIP circuit. The former may be referred to as a "pixel circuit portion PIXc", and the latter may be referred to as a "GIP circuit portion GIPc". "GIPcA" and "GIPcB" are GIP circuit portions GIPc that are dispersedly disposed. The GIP circuit portion GIPc may be selectively disposed only in a specific pixel. For example, a part of the GIP circuit portion GIPc is located in some of the pixels, and the GIP circuit portion GIPc may be not located in the other of the pixels.

The display panel driving circuit includes a data driving circuit that supplies the data voltage of the input image to the data lines DL of the display panel PNL, a gate driving circuit that supplies a scan pulse synchronized with the data voltage to the gate lines GLs of the display panel PNL, a timing controller 20 for controlling operation timing of the data driving circuit and the GIP circuit, and the like.

The data driving circuit may include one or more source driver ICs (SICs). The source driver IC (SIC) converts digital video data of the input image into an analog gamma compensation voltage under the control of the timing controller 20 to generate a data voltage and outputs the data voltage to the data lines DL. The source driver IC SIC may be mounted on a flexible circuit board, for example, a chip on film (COF), which is capable of being bent, or directly adhered to a substrate of the display panel PNL by a chip on glass (COG) process. The COFs are bonded to a source PCB SPCB and a lower substrate of the display panel PNL through an anisotropic conductive film (ACF). Input pins of the COFs are electrically connected to output terminals of the source PCB SPCB. Output pins of the COFs are electrically connected to data pads formed on the substrate of the display panel PNL through ACF.

The gate driving circuit includes a level shifter 22 that converts the voltage of the gate timing signal from the timing controller 20 into gate-on voltage (VGH) and gate-off voltage (VGL) and a GIP circuit that outputs a scan pulse in response to a gate timing control signal received through the level shifter 22. The gate driving circuit sequentially supplies gate pulses synchronized with the data voltage to the gate lines GL under the control of the timing controller 20 to select pixels of one pixel line into which pixel data of the input image is written. The one pixel line includes a plurality of pixels arranged along the first direction and will be described in detail hereinafter.

A circuit in a lower part of FIG. 1 is an example of a GIP circuit that is dispersedly disposed within a pixel of the active area AA.

The GIP circuit includes a shift register. The GIP circuit receives gate timing control signals such as a start pulse and a shift clock, and outputs a gate pulse to the gate lines GLs when a shift clock is input. The GIP circuit sequentially shifts the scan pulses according to shift clock timing by using stages that are cascade-connected.

Each of the sub-pixels in the pixel may include a light emitting element, for example, an organic light emitting diode (hereinafter, referred to as "OLED").

In FIG. 1, a part indicated by a dotted circle in the active area AA is for explaining an example of a pixel circuit portion PIXc, and is a circuit diagram configuring one sub-pixel. The pixel circuit portion PIXc is not limited to the configuration shown in FIG. 1.

In FIG. 1, the pixel circuit portion PIXc may include an organic light emitting diode (hereinafter, referred to as "OLED"), a driving TFT DT, a storage capacitor Cst, a first switch TFT ST1, and a second switch TFT ST2.

The OLED includes an organic compound layer OL disposed between an anode and a cathode. The organic compound layer OL includes a hole injection layer (HIL), a hole transport layer (HTL), an emission layer (EML), an electron transport layer (ETL), an electron injection layer (EIL), and the like, but not limited thereto. The OLED emits light due to excitons generated by electrons and holes moving to the light emitting layer (EML), when a voltage equal to or greater than its threshold voltage is applied between an anode and a cathode.

The driving TFT DT includes a gate connected to a source of the first switch TFT ST1, a drain to which a high potential pixel driving voltage EVDD is applied, and a source connected to an anode of the OLED and a drain of the second switch TFT ST2. The driving TFT DT adjusts the current flowing through the OLED according to a gate-source potential difference Vgs. The driving TFT DT is turned on when the gate-source potential difference Vgs is greater than a threshold voltage Vth, and as the gate-source potential difference Vgs increases, a current Ids flowing between source and drain of the driving TFT DT increases. When a source potential of the driving TFT DT is greater than the threshold voltage of the OLED, the current Ids between source and drain of the driving TFT DT flows through the OLED. As the current flowing through the OLED increases, a light emission amount from the OLED increases, whereby a desired gradation is realized.

The storage capacitor Cst maintains a gate-source voltage of the driving TFT DT. The first switch TFT ST1 has a gate connected to the gate line GL, a drain connected to the data line DL, and a source connected to a gate of the driving TFT DT. The first switch TFT ST1 is turned on in response to a scan pulse SCAN to apply a data voltage Vdata on the data line DL to the gate of the driving TFT DT.

A gate of the second switch TFT ST2 is connected to the gate line GL, and a drain of the second switch TFT ST2 is connected to a node between a source of the driving TFT DT and an anode of the OLED. A source of the second switch TFT ST2 is supplied with a reference voltage Vref through a sensing line.

The anode of the OLED is connected to the source of the driving TFT DT, the storage capacitor Cst, and the drain of the second switch TFT ST2. The cathode of the OLED is applied with a low potential pixel reference voltage EVSS.

The timing controller 20 receives an input image data from an external host system and transmits the same to the source driver IC (SIC). The timing controller 20 receives timing signals such as vertical/horizontal synchronization signals, a data enable signal, and a main clock signal, and generates timing control signals for controlling the operation timing of the source driver IC SIC, the GIP circuit, and the touch sensor. The host system may be any one of a television (TV) system, a set top box, a navigation system, a DVD player, a Blu-ray player, a personal computer (PC), a home theater system, and a phone system.

The timing controller 20 and the level shifter 22 may be disposed on a control board CPCB. The control board CPCB may be connected to a source PCB SPCB through a flexible flat cable FFC. The gate timing control signal required for driving the shift register, that is, a start pulse, a shift clock, and the like, may be supplied to the GIP circuit through dummy channel line formed on the COF and line on glass (LOG) line formed on the lower substrate of the display panel PNL.

Figure 3:
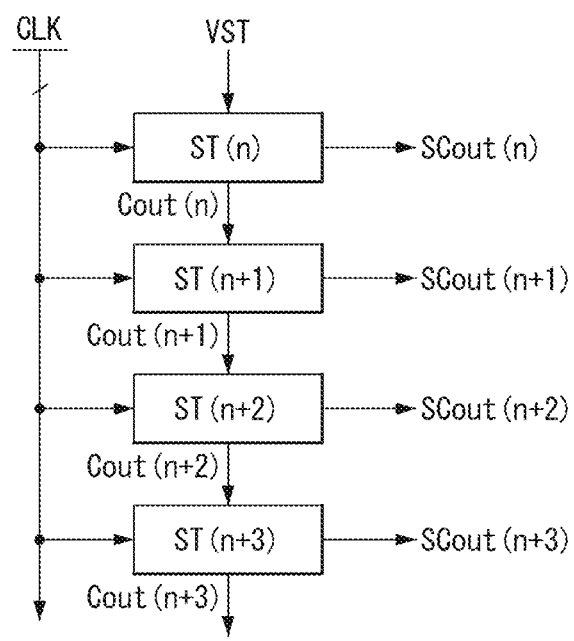
FIG. 3 is a view schematically illustrating stages that are cascade-connected in a GIP circuit.
Figure 4:
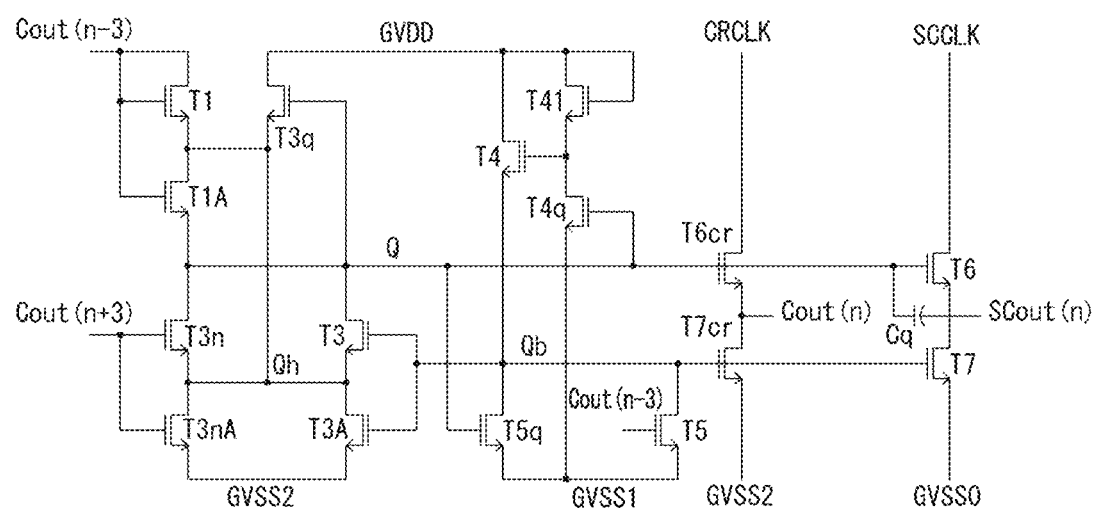
FIG. 4 is a circuit diagram illustrating an example of a GIP circuit.

FIG. 3 is a view schematically illustrating stages that are cascade-connected in a GIP circuit; and FIG. 4 is a circuit diagram illustrating an example of a GIP circuit. The GIP circuit shown in FIG. 4 represents the n-th stage.

Referring to FIG. 3, the GIP circuit includes stages S(n) to S(n+3), that are cascade-connected through carry signal line to which carry signals Cout(n) to Cout(n+3) are transmitted to shift the gate pulse in accordance with shift clock CLK timing. The stages S(n) to S(n+3) sequentially supplies gate pulses Scout(n) to Scout(n+3) to the gate lines GLs and transmits carries signals Cout(n) to Cout(n+3)) to another stage, respectively. The gate pulses Scout(n) to Scout(n+3) and the carry signals Cout(n) to Cout(n+3) are simultaneously outputted through one output terminal in each of the stages S(n) to S(n+3) or separated through two output terminals in each stage, as in examples of FIGS. 3 and 4. The stage to which the carry signals Cout(n) to Cout(n+3) are transmitted is not limited to a specific stage. For example, as illustrated in FIG. 4, the n-th (n is a positive integer) stage may receive the carry signals Cout(n−3) and Cout(n+3) output from the (n−3)-th stage and the (n+3)-th stage, but is not limited thereto.

Referring to FIG. 4, the GIP circuit includes a first output circuit portion outputting the gate pulse Scout(n) through the first output terminal according to Q node and Qb node voltages, a second output circuit portion outputting the carry signal Cout(n) through the second output terminal according to the Q node and Qb node voltages, a switch circuit for charging and discharging the Q node and Qb node, and the like.

The first output circuit portion includes a first pull-up transistor T6 that is turned on when a shift clock SCCLK is input in a state where the Q node is pre-charged to charge a voltage of the first output terminal, and a first pull-down transistor T7 that discharges the voltage of the first output terminal when the Qb node voltage is charged. A capacitor Cq is connected between the Q node and the first output terminal. The first pull-up transistor T6 includes a gate connected to the Q node, a drain to which the shift clock SCCLK is applied, and a source connected to the first output terminal. The first pull-down transistor T7 includes a gate connected to the Qb node, a drain connected to the first output terminal, and a source connected to the GVSS0 node. A gate low voltage VGL0 is applied to the GVSS0 node.

The second output circuit portion includes a second pull-up transistor T6cr that is turned on when the shift clock CRCLK is input in a state where the Q node is pre-charged to charge a voltage of the second output terminal, and a second pull-down transistor T7cr that discharges the voltage of the second output terminal when the Qb node voltage is charged. The second pull-up transistor T6cr includes a gate connected to the Q node, a drain to which the shift clock CRCLK is applied, and a source connected to the second output terminal. The second pull-down transistor T7cr includes a gate connected to the Qb node, a drain connected to the second output terminal, and a source connected to the GVSS2 node. A gate low voltage VGL2 is applied to the GVSS2 node. The VGL2 may be set to a voltage lower than VGL0.

The switch circuit charges and discharges the Q node, Qb node, and Qh node using a plurality of TFTs T1, T1A, T3, T3q, T3A, T3n, T3 nA, T4, T41, T4q, T5, and T5q.

The TFTs T1 and T1A charge the voltages of the Q node and Qh node with a VGH of the carry signal Cout(n−3) in response to the carry signal Cout(n−3) from the (n−3)-th stage. The TFT T1 includes a gate and a drain to which the carry signal Cout(n−3) is applied, and a source connected to the Qh node. The TFT T1A includes a gate to which the carry signal Cout(n−3) is applied, a drain connected to the Qh node, and a source connected to the Q node.

The TFT T3q is turned on in response to the voltage of the pre-charged Q node to connect the Qh node to the GVDD, thereby charging the Qh node with a VGH applied through the GVDD node. The TFT 3q includes a gate connected to the Q node, a drain connected to the GVDD node, and a source connected to the Qh node.

The TFTs T3n and T3 nA connect the Q node and the Qh node to the GVSS2 node to discharge the Q node and the Qh node in response to the carry signal Cout(n+3) from the next stage. The TFT T3n includes a gate to which the carry signal Cout (n+3) is applied, a drain connected to the Q node, and a source connected to the Qh node. The TFT T3 nA includes a gate to which the carry signal Cout(n+3) is applied, a drain connected to the Qh node, and a source connected to the GVSS2 node.

The TFTs T3 and T3A are turned on in response to the Qb node to connect the Q node and the Qh node to the GVSS2 node, thereby discharging the Q node. The TFT T3 includes a gate connected to the Qb node, a drain connected to the Q node, and a source connected to the Qh node. The TFT T3A includes a gate connected to the Qb node, a drain connected to the Qh node, and a source connected to the GVSS2 node.

The TFTs T4, T41, and T4q charge the Qb node with the VGH when the Q node voltage is uncharged. The TFT T41 includes a gate and a drain connected to the GVDD node to which the VGH is applied, and a source connected to a gate of the TFT T4 and a drain of the TFT T4q. The TFT T4 includes a gate connected to a source of the TFT T41 and the drain of the TFT T4q, a drain connected to the GVDD node, and a source connected to the Qb node. The TFT T4q includes a gate connected to the Q node, a drain connected to a source of the TFT T41 and a gate of the TFT T4, and a source connected to the GVSS1 node. A gate low voltage VGL1 is applied to the GVSS1 node. The gate low voltage VGL1 may be set to a voltage lower than the gate low voltage VGL0 and higher than the gate low voltage VGL2.

The TFT T5q is turned on according to the voltage of the pre-charged Q node to connect the Qb node to the GVSS1 node, thereby discharging the Qb node. The TFT T5q includes a gate connected to the Q node, a drain connected to the Qb node, and a source connected to the GVSS1 node.

The TFT T5 is turned on in response to the carry signal Cout(n−3) from the (n−3)-th stage to discharge the Qb node. The TFT T5 includes a gate to which the carry signal Cout(n−3) is applied, a drain connected to the Qb node, and a source connected to the GVSS1 node.

Figure 5:
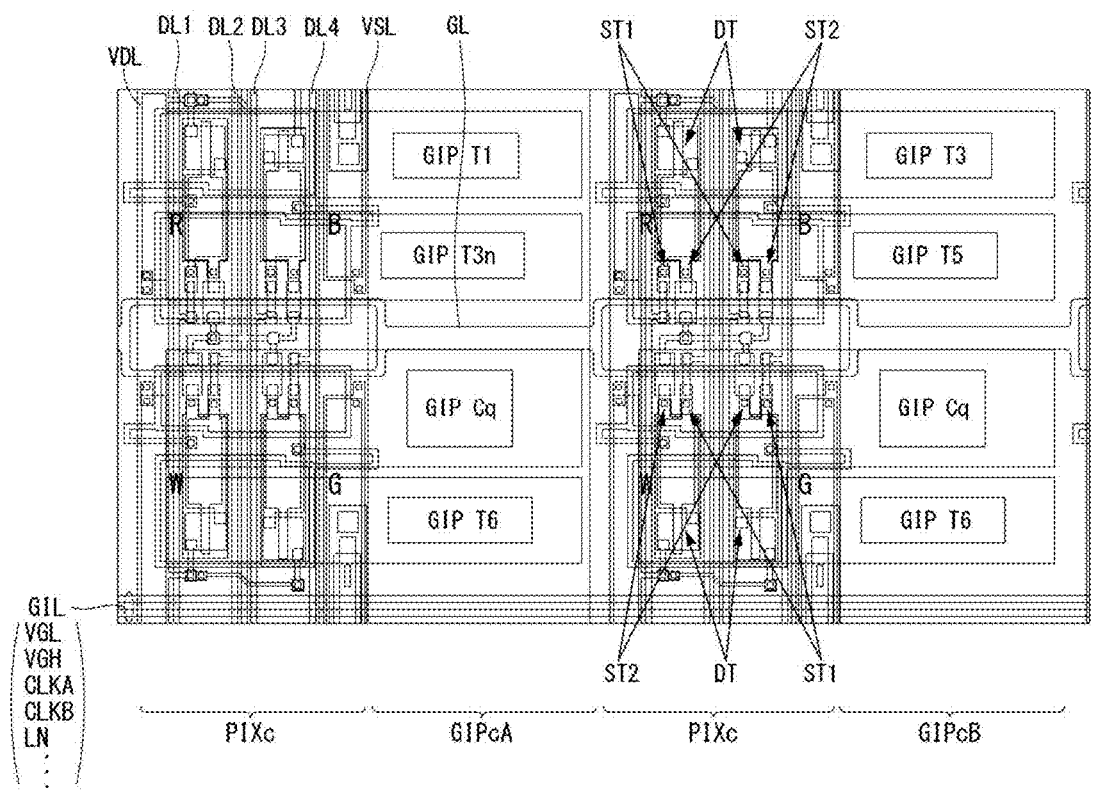
FIG. 5 is a view illustrating an example of a planar structure of two pixels.

FIG. 5 is a view illustrating an example of a planar structure of two pixels.

Referring to FIG. 5, some of the pixels are divided into a pixel circuit portion PIXc and a GIP circuit portion GIPc. TFTs of the pixel circuit portion PIXc and TFTs of the GIP circuit portion GIPc may be spatially separated.

Any one pixel may include a pixel circuit portion PIXc and a GIP circuit portion GIPcA constituting one part of the GIP circuit, and the other pixel may include a pixel circuit portion PIXc and a GIP circuit portion GIPcB constituting the other part of the GIP circuit. For example, the GIPcA may include TFTs T1, T3n, and T6, a capacitor Cq, and the like in the GIP circuit shown in FIG. 4. The GIPcB may include TFTs T3, T5, and T6, a capacitors Cq, and the like in the GIP circuit shown in FIG. 4.

The line connected to the pixel circuit portion PIXc may include a VDL line, VSL line, DL lines, GL line, or the like. The VDL line is a power line to which EVDD is applied, and the VSL line is a power line to which EVSS is applied. DL1 to DL4 lines are data lines to which data voltage is applied. The first data line DL1 is connected to the first sub-pixel R to supply a corresponding data voltage to the first sub-pixel R. The second data line DL2 is connected to the second sub-pixel W to supply a corresponding data voltage to the second sub-pixel W. The third data line DL3 is connected to the third sub-pixel B to supply a corresponding data voltage to the third sub-pixel B. The fourth data line DL4 is connected to the fourth sub-pixel G to supply a corresponding data voltage to the fourth sub-pixel G. The GL line is a gate line to which a gate pulse is supplied.

The GIP line GIL connected to the GIP circuit portion GIPc may be a line that transmits a predetermined signal to the GIP circuit portions GIPc or connects the GIP circuit portions GIPc to each other. There may be a plurality of GIP lines GILs.

For example, the GIP line GIL may include a VGL line, a VGH line, a CLKA line, a CLKB line, and an LN line. The VGL line is a line connected to VSS nodes GVSS0, GVSS1, and GVSS2 in the GIP circuit of FIG. 4 to supply a gate low voltage VGL. The VGH line is a line connected to a VDD node GVDD in the GIP circuit of FIG. 4 to supply a gate high voltage VGH. The CLKA line and CLKB line are clock lines to which shift clocks are applied. The LN line is a line that electrically connects the GIP circuit portions GIPcA and GIPcB.

Hereinafter, for convenience of description, a case where there are four GIP lines GILs connected to GIP circuit portions GIPc allocated to one pixel line will be described as an example. The four GIP lines GILs may be lines that transmit signals and/or power different from each other.

Figure 6:
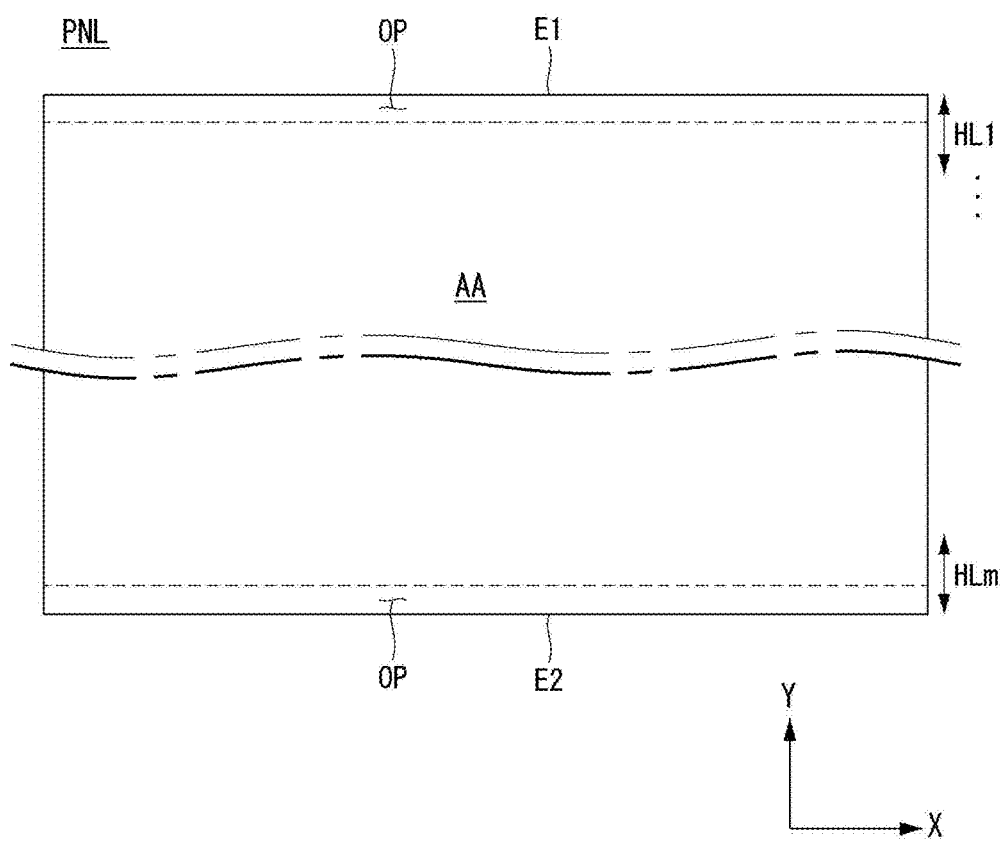
FIG. 6 is a plan view schematically illustrating a display panel according to an embodiment of the present disclosure.
Figure 7:
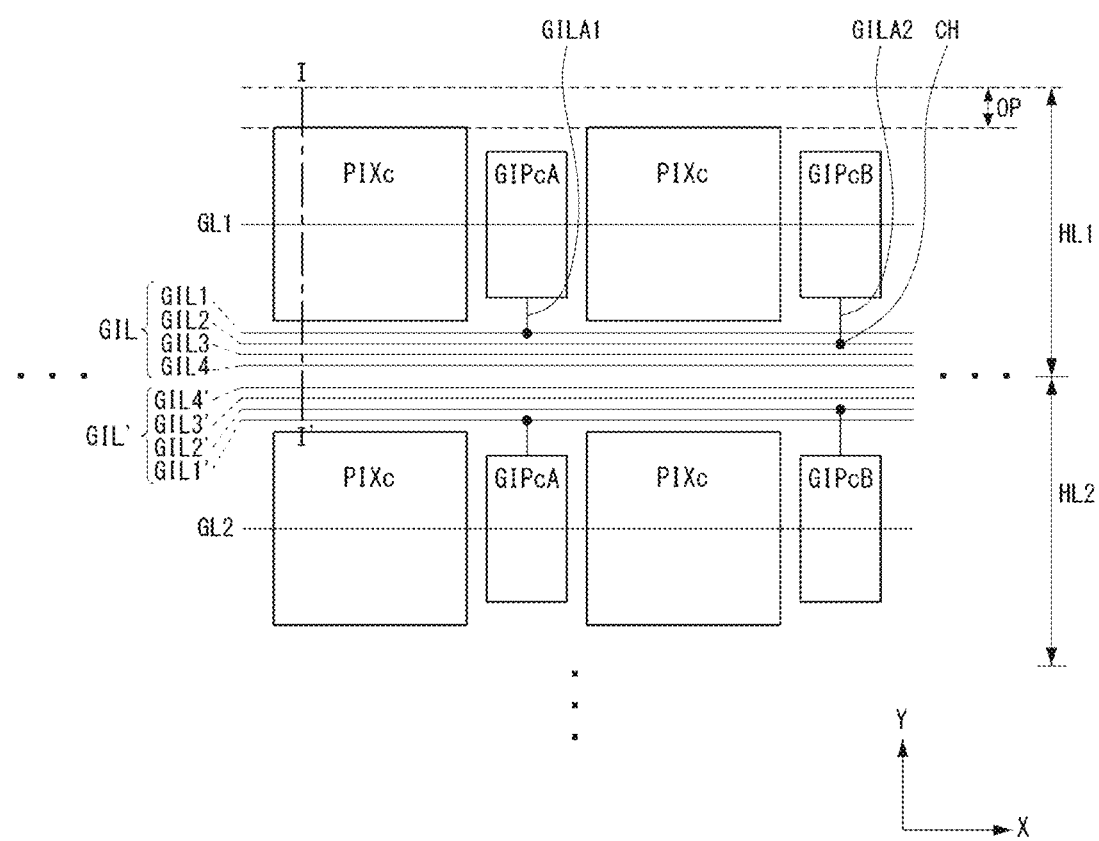
FIGS. 7 to 9 are views illustrating an arrangement example of pixel circuit portions, GIP circuit portions, and GIP lines corresponding to a pixel line, respectively.
Figure 8:
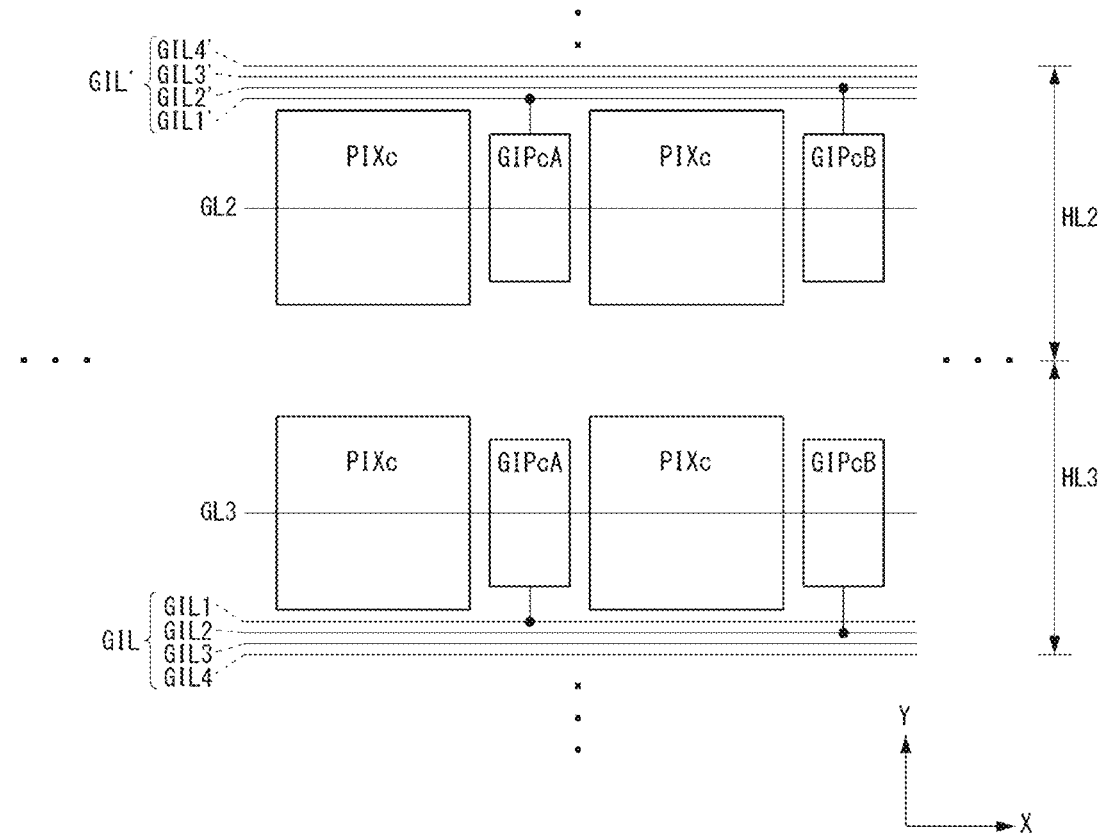
Figure 9:
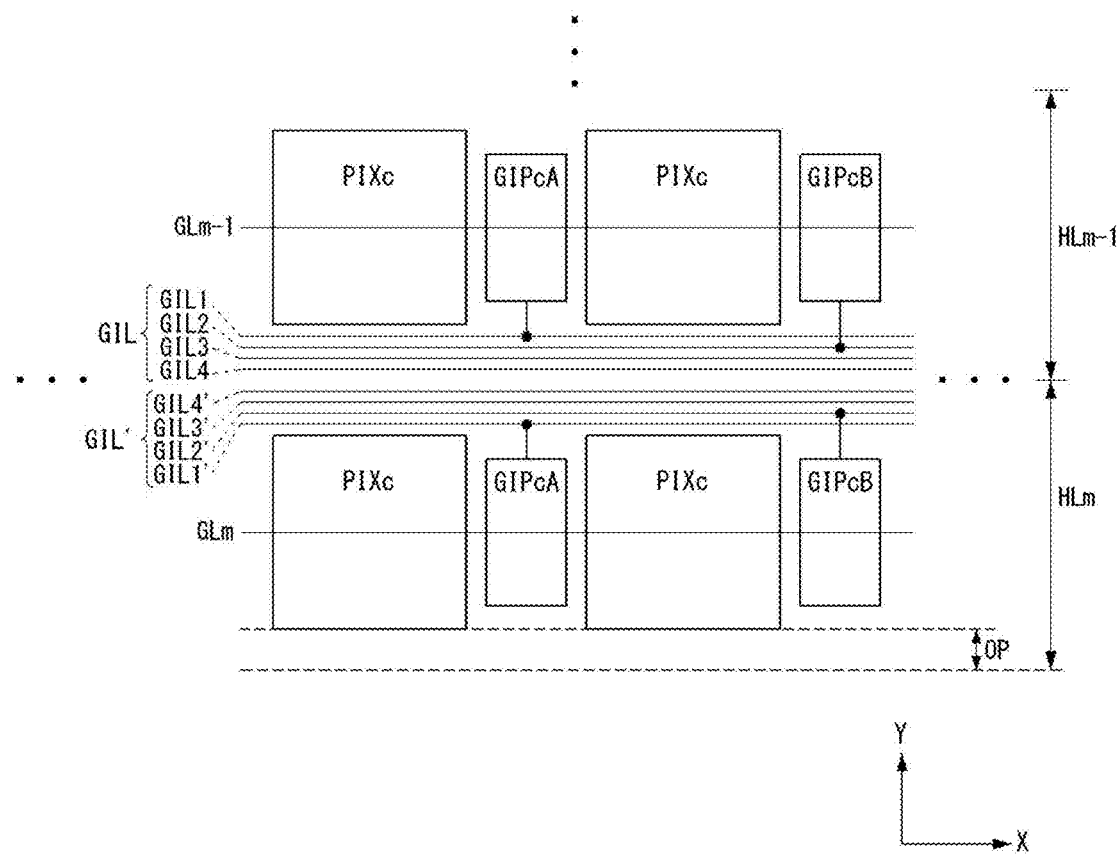
Figure 10:
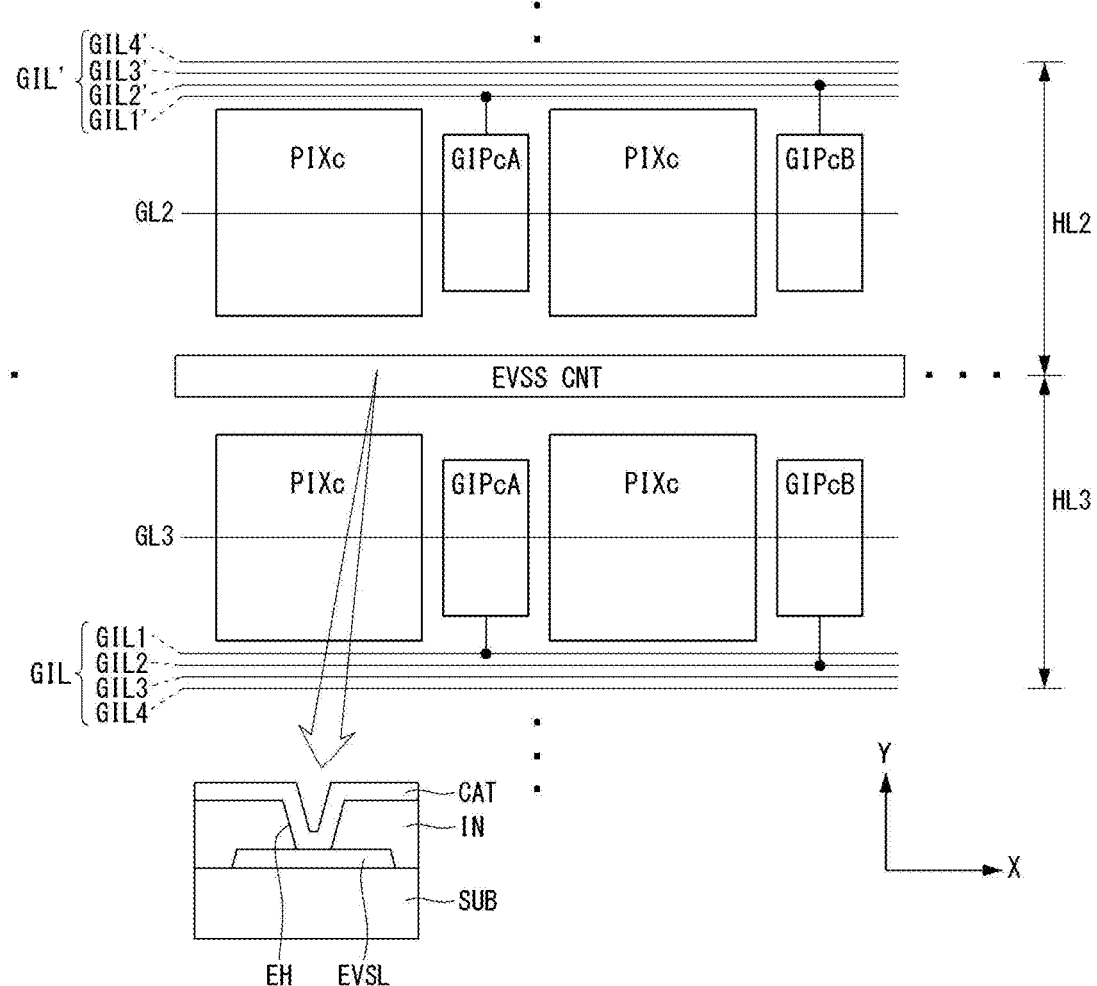
FIG. 10 is a view illustrating an arrangement example of an EVSS contact portion.

FIG. 6 is a plan view schematically illustrating a display panel according to an embodiment of the present disclosure. FIGS. 7 to 9 are views illustrating an arrangement example of pixel circuit portions, GIP circuit portions, and GIP lines corresponding to a pixel line, respectively. FIG. 10 is a view illustrating an arrangement example of an EVSS contact portion.

Referring to FIG. 6, the display panel PNL according to an embodiment of the present disclosure includes an active area AA including a plurality of pixels for realizing an input image. The pixels may be arranged in a matrix form along the first and second directions intersecting in the active area AA.

The active area AA may be defined by a plurality of pixel lines HL1 to HLm. The pixel lines HL1 to HLm each include a plurality of pixels arranged along a first direction and may be sequentially defined along a second direction. Pixels disposed on each of the pixel lines HL1 to HLm may be applied with a gate pulse through at least one of the gate lines GL1 to GLm.

Referring to FIGS. 7 to 9, at least some of the pixels may include a pixel circuit portion PIXc and a GIP circuit portion GIPc. The GIP circuit portions GIPc may be selectively disposed only in some of the pixels. Each of the GIP circuit portions GIPcs may include a part of a shift register. The GIP circuit portions GIPcs are electrically connected to each other, and supplied with a predetermined external signal and/or power, thereby finally outputting a gate pulse.

For example, the pixel circuit portions PIXcs arranged in the first pixel line HL1 may receive the first gate pulse output by the GIP circuit portions GIPcA, GIPcB, and . . . dispersedly disposed on the first pixel line HL1 through the first gate line GL1. The pixel circuit portions PIXcs arranged in the m-th (m is a natural number of 2 or more) pixel lines HLm may receive the m-th gate pulse output by the GIP circuit portions GIPcA, GIPcB, and . . . dispersedly disposed on the m-th pixel line HLm through the m-th gate line GLm.

The shift register may include GIP lines GILs for transferring the predetermined external signal and/or power to dispersedly disposed GIP circuit portions GIPcs or connecting the dispersedly disposed GIP circuit portions GIPcs to each other.

The GIP lines GILs may extend along the first direction. Herein, the GIP lines GILs may be connected to GIP circuit portions GIPcs through auxiliary GIP lines GILAs. The auxiliary GIP line GILA1 is a part branched from the GIP line GIL and may be disposed on the same layer as the GIP line GIL. Alternatively, the auxiliary GIP lines GILA2s may be disposed on a layer other than the GIP lines GILs with at least one insulating layer in between, and may be connected through a contact hole CH passing through the at least one insulating layer.

The GIP lines GILs may be located only between neighboring pixels along the second direction. This means that GIP lines GILs are not disposed between one end E1 of the display panel PNL and the first pixel line HL1 adjacent thereto in the second direction, and may mean that GIP lines GILs are not disposed between the other end E2 of the display panel PNL and the m-th pixel line HLm adjacent thereto in the second direction. Herein, the position where the GIP lines GILs are not disposed may correspond to an open portion OP in which at least a part of an organic insulating film such as a planarization film and/or a bank layer is removed. In addition, this may mean that GIP lines GILs may be selectively located only at a predetermined position among areas between neighboring pixels along the second direction.

In other words, the GIP lines GILs may be located only between the (2n−1)-th (n is a natural number greater than or equal to 1) pixel line and the 2n-th pixel line among the pixel lines HL1 to HLm.

For example, the GIP line GIL may include the (2n−1)-th GIP lines GILs and the 2n-th GIP lines GIL's sequentially arranged along the second direction between the (2n−1)-th pixel line and the 2n-th pixel line neighboring along the second direction. The (2n−1)-th GIP lines GILs may be lines connected to GIP circuit portions GIPcs disposed in the (2n−1)-th pixel line. The 2n-th GIP lines GIL's may be lines connected to the GIP circuit portions GIPcs disposed in the 2n-th pixel line. The (2n−1)-th GIP lines GILs and the 2n-th GIP lines GIL's may be symmetrically arranged with respect to a virtual reference line extending in the first direction between the (2n−1)-th pixel line and the 2n-th pixel line that are neighboring.

More specifically, the GIP line GIL may include a 1-1 GIP line GIL1, a 1-2 GIP line GIL2, and a 1-3 GIP line GIL3, a 1-4 GIP line GIL4, a 2-4 GIP line GIL4', a 2-3 GIP line GIL3', a 2-2 GIP line GIL2', and a 2-1 GIP line GIL1', which are sequentially arranged along the second direction between the (2n−1)-th pixel line and the 2n-th pixel line neighboring along the second direction. The 1-1 GIP line GIL1, the 1-2 GIP line GIL2, the 1-3 GIP line GIL3, and the 1-4 GIP line GIL4 may be lines connected to the GIP circuit portions GIPcs arranged in the (2n−1)-th pixel line. The 2-4 GIP line GIL4', the 2-3 GIP line GIL3', the 2-2 GIP line GIL2', and the 2-1 GIP line GIL1' may be lines connected to the GIP circuit portions GIPcs arranged in the 2n-th pixel line.

Herein, the same type of signal (or voltage) may be applied to the 1-1 GIP line GIL1 and the 2-1 GIP line GIL1', and the same type of signal (or voltage) may be applied to the 1-2 GIP line GIL2 and the 2-2 GIP line GIL2'. In addition, the same type of signal (or voltage) is applied to the 1-3 GIP line GIL3 and the 2-3 GIP line GIL3', and the same type of signal (or voltage) is applied to the 1-4 GIP line GIL4 and the 2-4 GIP line GIL4'. That is, the 1-1 GIP line GIL, the 1-2 GIP line GIL2, the 1-3 GIP line GIL3, the 1-4 GIP line GIL4, and the 2-4 GIP line GIL4, the 2-3 GIP line GIL3', the 2-2 GIP line GIL2', and the 2-1 GIP line GIL1' may be arranged symmetrically with respect to the virtual reference line extending in the first direction. The same type of signal may be any one selected from a shift clock, a power supply voltage such as VGH, VGL, and the like. However, it should be noted that the same signal here means the same kind, but not the same phase.

Referring to FIG. 10, an EVSS line EVSL to which a low potential pixel reference voltage EVSS is applied and an EVSS contact portion EVSS CNT to which a cathode CAT of the light emitting element is connected may be selectively located between the 2n-th pixel line and the (2n+1)-th pixel line. That is, the EVSS contact portion EVSS CNT may be selectively allocated to an area where GIP lines GILs are not disposed. Herein, as an area where the GIP lines GILs are disposed and an area where the EVSS contact portion EVSS CNT is disposed are physically separated from each other, there are advantages that signal interference may be reduced and design freedom may be improved.

Further, since the EVSS contact portion EVSS CNT may be arranged in a plurality of areas, luminance uniformity may be improved. More specifically, since a cathode of the light emitting element is formed widely in such a manner as to cover most of the active area AA, there is a problem that the power supply voltage applied to the cathode does not have a uniform voltage value across the entire surface. For example, as a difference between the voltage value at an inlet part to which the power supply voltage is applied by the resistance of the cathode and the voltage value at the position spaced apart from the inlet part increases, the luminance difference according to the position may increase. Such a problem may be greater at a top emission type display device. In the top emission type display device, since the cathode needs to have a predetermined transmittance, the cathode is formed of a transparent conductive material such as Indium Tin Oxide (ITO). Herein, since the surface resistance is increased, the luminance difference according to the position may also be significantly increased correspondingly. In a preferred embodiment of the present disclosure, the EVSS contact portion EVSS CNT may be disposed in a plurality of areas in the active area. Therefore, since the low potential pixel reference voltage EVSS may be supplied to the cathode in a plurality of areas, it is possible to significantly reduce a problem of the luminance difference abovementioned.

The EVSS line EVSL and the cathode CAT of the light emitting element may be disposed on layers different from each other with at least one insulating layer IN in between, and be connected to each other through an EVSS contact hole EH passing through the insulating layer IN. The EVSS line EVSL may be disposed on the same layer as at least one of a light blocking layer LS (see FIG. 11), a source/drain electrode SE and DE, an anode ANO, which will be described later, but is not limited thereto.

Figure 11:
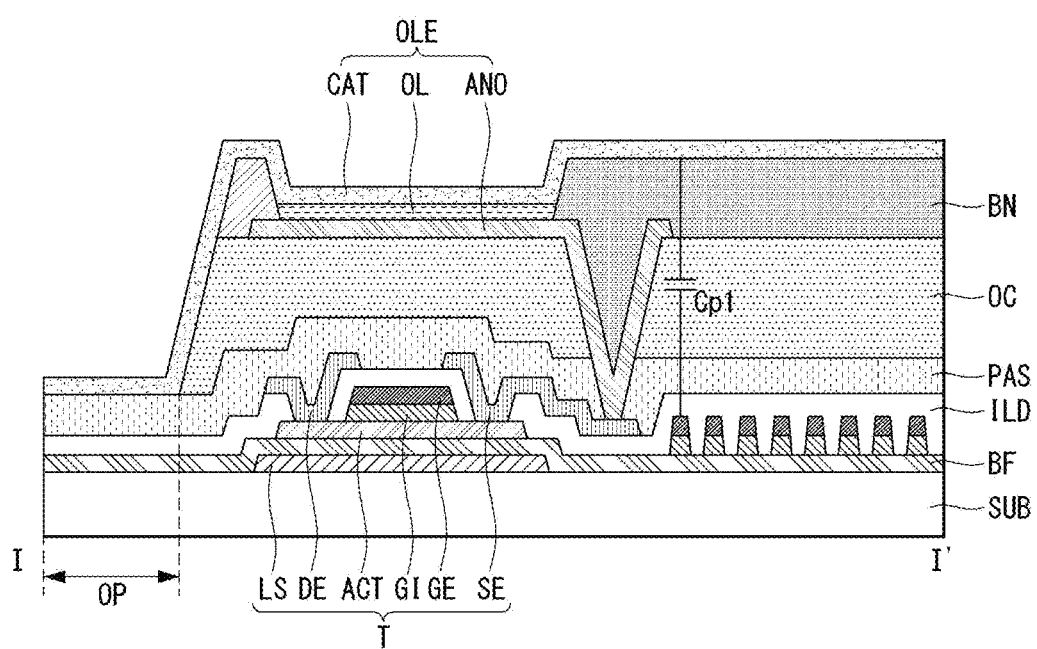
FIG. 11 is a cross-sectional view taken along a line I-I' in FIG. 7.

FIG. 11 is a cross-sectional view taken along a line I-I' in FIG. 7.

Referring to FIG. 11, a display device according to an embodiment of the present disclosure includes a display panel PNL having a substrate. The substrate SUB may be made of glass or plastic. For example, the substrate SUB is formed of plastic materials such as polyimide (PI), polyethylene terephthalate (PET), polyethylene naphthalate (PEN), polycarbonate (PC), and the like, to have flexible properties. On the substrate SUB, a TFT T and an OLED OLE electrically connected to the TFT T may be disposed.

A light blocking layer LS and a buffer layer BF may be formed between the substrate SUB and the TFT T. The light blocking layer LS is disposed in such a manner as to overlap a semiconductor layer of the TFT T, in particular, a channel, and serves to protect an oxide semiconductor element from external light. The buffer layer BF serves to block ions or impurities diffused from the substrate SUB, and to prevent moisture from penetrating form the outside.

The TFT T includes a semiconductor layer ACT, a gate electrode GE, and source/drain electrodes SE and DE.

The semiconductor layer ACT is disposed on the buffer layer BF. A gate insulating layer GI and the gate electrode GE are disposed on the semiconductor layer ACT. The gate insulating layer GI may be formed of a silicon oxide layer SiOx to insulate the gate electrode GE, but is not limited thereto. The gate electrode GE is made of any one selected among from a group consisting of copper (Cu), molybdenum (Mo), aluminum (Al), chromium (Cr), gold (Au), titanium (Ti), nickel (Ni), neodymium (Nd), and tantalum (Ta), and tungsten (W), or single layer or multiple layers of an alloy thereof.

The gate insulating layer GI and the gate electrode GE may be simultaneously patterned using the same mask, in which the gate insulating layer GI and the gate electrode GE may have a coplanar shape. Although not illustrated, the gate insulating layer GI may be formed in such a manner as to cover the entire surface of the substrate SUB.

An interlayer insulating layer ILD is disposed on the gate electrode GE. The interlayer insulating film ILD is to insulate the gate electrode GE and the source/drain electrodes SE and DE from each other, and may be formed of a silicon oxide film (SiOx), a silicon nitride film (SiNx), or a multilayer thereof, but is not limited thereto.

The source and drain electrodes SE and DE are disposed on the interlayer insulating layer ILD. The source electrode SE and the drain electrode DE are spaced apart at predetermined intervals. The source electrode SE contacts one side of the semiconductor layer ACT through a source contact hole passing through the interlayer insulating layer ILD. The drain electrode DE contacts the other side of the semiconductor layer ACT through a drain contact hole passing through the interlayer insulating film ILD.

The source electrode SE and the drain electrode DE may be formed of a single layer or multiple layers. In the case of the single layer, the source electrode SE and the drain electrode DE may be made of any one selected from a group consisting of molybdenum (Mo), aluminum (Al), chromium (Cr), gold (Au), titanium (Ti), Nickel (Ni), neodymium (Nd) and copper (Cu), or an alloy thereof. In addition, in the case of the multiple layers, the source electrode SE and the drain electrode DE may be made of a double layer of molybdenum/aluminum-neodymium, molybdenum/aluminum, titanium/aluminum, or copper/molytitanium, or a triple layer of molybdenum/aluminum-neodymium/molybdenum, molybdenum/aluminum/molybdenum, titanium/aluminum/titanium, or molytitanium/copper/molytitanium.

A passivation film PAS is located on the TFT T. The passivation film PAS protects the TFT T, and may be made of silicon oxide (SiOx), silicon nitride (SiNx), or a multilayer thereof.

A planarization film OC is located on the passivation film PAS. The planarization film OC is to flatten the lower step, and may be made of organic materials such as photo acryl, polyimide, benzocyclobutene resin, acrylate resin, and the like. If necessary, any one of the passivation film PAS and the planarization film OC may be omitted.

The organic light emitting diode OLE is located on the planarization film OC. The organic light emitting diode OLE includes an anode ANO, an organic compound layer OL, and a cathode CAT.

In more detail, the anode ANO is located on the planarization film OC. The anode ANO may be connected to the source electrode SE of the TFT T through a contact hole passing through the passivation film PAS and the planarization film OC.

When the display device is implemented in a top emission type, the anode ANO may function as a reflective electrode including a reflective layer. The reflective layer may be made of aluminum (Al), copper (Cu), silver (Ag), nickel (Ni), or an alloy thereof, preferably silver/palladium/copper (APC) alloy. The anode ANO may be formed of a multilayer including a reflective layer. When the display device is implemented in a bottom emission type, the anode ANO may be formed of a transparent conductive material such as Indium Tin Oxide (ITO) and Indium Zinc Oxide (IZO) to allow light to pass therethrough.

A bank layer BN partitioning the sub-pixels is located on the substrate SUB on which the anode ANO is formed. The bank layer BN may be made of organic materials such as polyimide, benzocyclobutene series resin, acrylate, and the like.

The bank layer BN includes an opening exposing most of the anode ANO. The bank layer BN may be disposed in such a manner as to expose the center portion of the anode ANO and cover the side end of the anode ANO. The area of the exposed anode ANO is preferably designed to the maximum possible to ensure a sufficient aperture ratio. The center portion of the anode ANO exposed by the bank layer BN may be defined as a light emitting area.

The organic compound layer OL is located on the substrate SUB on which the bank layer BN is formed. The organic compound layer OL, as a layer in which electrons and holes are combined to emit light, may include an emission layer (EML) and further include at least one of a hole injection layer (HIL), a hole transport layer (HTL), and an electron transport layer (ETL), and an electron injection layer (EIL).

The cathode CAT is located on the organic compound layer OL. The cathode CAT may be formed widely on the top surface of the substrate SUB. When the display device is implemented in a top emission type, the cathode CAT may be formed of a transparent conductive material such as indium tin oxide (ITO) or indium zinc oxide (IZO), and may be made of magnesium (Mg), calcium (Ca), aluminum (Al), silver (Ag), or an alloy thereof having a thickness that is thin enough that light may be transmitted. When the display device is implemented in a bottom emission type, the cathode CAT may function as a reflective electrode. Herein, the cathode CAT may be made of aluminum (Al), copper (Cu), silver (Ag), nickel (Ni), or an alloy thereof, but is not limited thereto.

As illustrated in FIGS. 6 and 11, an open portion OP formed by removing at least one of the planarization layer OC and the bank layer BN is provided in the peripheral area of the substrate SUB. The planarization film OC and the bank layer BN are formed of an organic material and thus may be an inflow path of oxygen and moisture flowing from the outside. According to preferred embodiments of the present disclosure, the open portion OP is provided on the peripheral area of the substrate SUB to block the inflow path of the moisture, there is an advantage of preventing degradation of the light emitting element due to moisture penetration.

In a preferred embodiment of the present disclosure, in order to implement an extreme-narrow bezel or a zero bezel, the area occupied by the active area AA is set relatively wide. Accordingly, the open portion OP may be defined in such a manner as to overlap pixel lines HL1 and HLm located at one end and the other end in the second direction of the active area AA.

In a preferred embodiment of the present disclosure, the GIP line GIL is not formed in the open portion OP. This effect will be described with reference to the following drawings.

Figure 12:
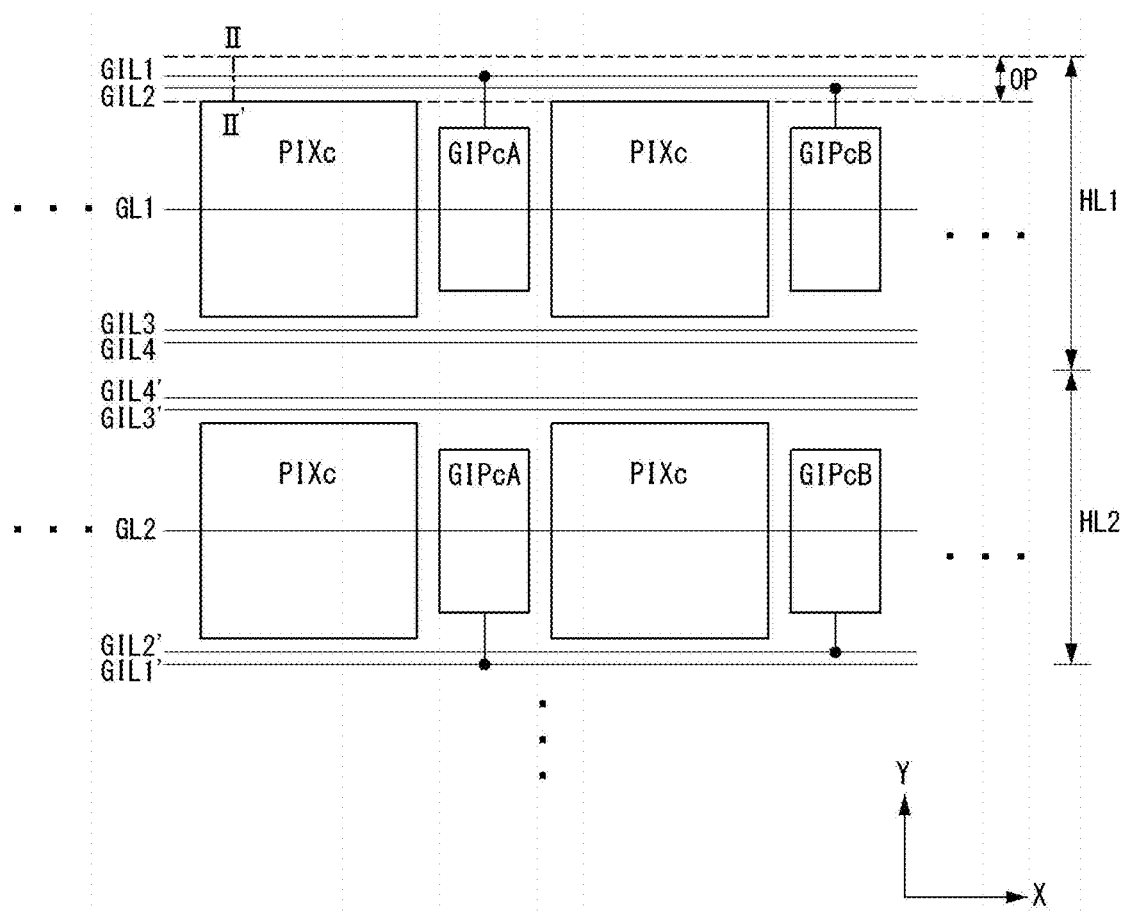
FIG. 12 shows a comparative example, which is to comparatively illustrate an effect of the present disclosure.
Figure 13:
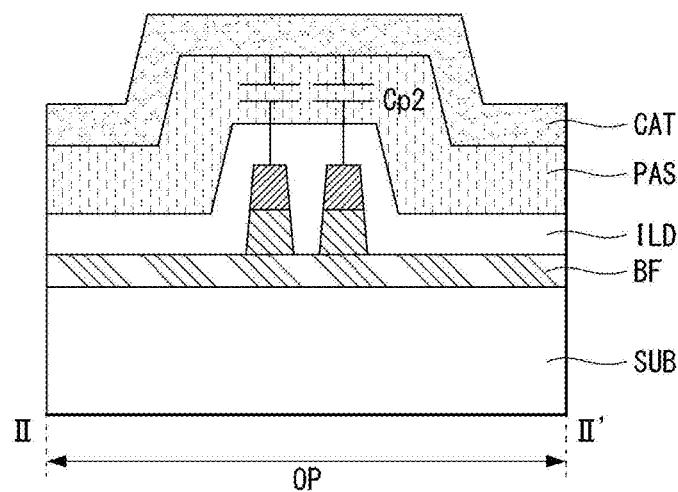
FIG. 13 is a cross-sectional view taken along a line II-II' in FIG. 12.

FIG. 12 shows a comparative example, which is to comparatively illustrate an effect of the present disclosure; and FIG. 13 is a cross-sectional view taken along a line II-II' in FIG. 12. In the comparative example, unlike the preferred embodiment of the present disclosure, the GIP line GIL is formed in the open portion OP.

Referring to FIGS. 12 and 13, since the organic insulating layer is removed from the open portion OP, when the GIP line GIL is located in the open portion OP, a parasitic capacitance Cp2 between the GIP line GIL and the cathode CAT increases, thereby causing a change in the potential of the cathode CAT of the light emitting element.

More specifically, the voltages of main nodes and the lines connected to the GIP circuit swing to a relatively large voltage between VGH and VGL. The parasitic capacitance Cp2 between such GIP circuit components and the cathode CAT is inversely proportional to the thickness of an insulating layer between them. Therefore, when a thickness of the insulating layer between the GIP circuit component and the cathode CAT is reduced, as the parasitic capacity Cp2 between the GIP line GIL and the cathode CAT increases, lighting failure of the pixel may occur due to a change in a potential of the cathode CAT of the light emitting element.

In addition, a difference in luminance may occur between pixels connected to each of the GIP lines GILs due to a difference in the parasitic capacitance Cp2 between the GIP lines GILs disposed in the open portion OP and the GIP lines GILs disposed in an area other than the open portion OP. For example, the 1-1 GIP line GIP1 connected to pixels of the first pixel line HL1 is located in the open portion OP, and the 2-1 GIP line GIP1' connected to pixels of the second pixel line HL2 may not be located in the open portion OP. Herein, a scan output to each of the first pixel line HL1 and the second pixel line HL2 may be different due to a difference of a parasitic capacitance between the 1-1 GIP line GIP1 and the cathode and a parasitic capacitance between the 2-1 GIP line GIP1' and the cathode, and thus a difference in luminance between the pixel lines may occur.

In a preferred embodiment of the present disclosure, as shown in FIG. 11, because the GIP lines GILs are not located in the open portion OP, the GIP line GIL and the cathodes CATs may maintain a certain distance in the area where the GIP line GIL is disposed. Accordingly, according to the preferred embodiment of the present disclosure, since it is possible to reduce the parasitic capacitance Cp1 between the GIP line GIL and the cathode CAT, there is an advantage of minimizing pixel lighting failure and luminance deviation caused due to variations in the potential of the cathode CAT.

Figure 14:
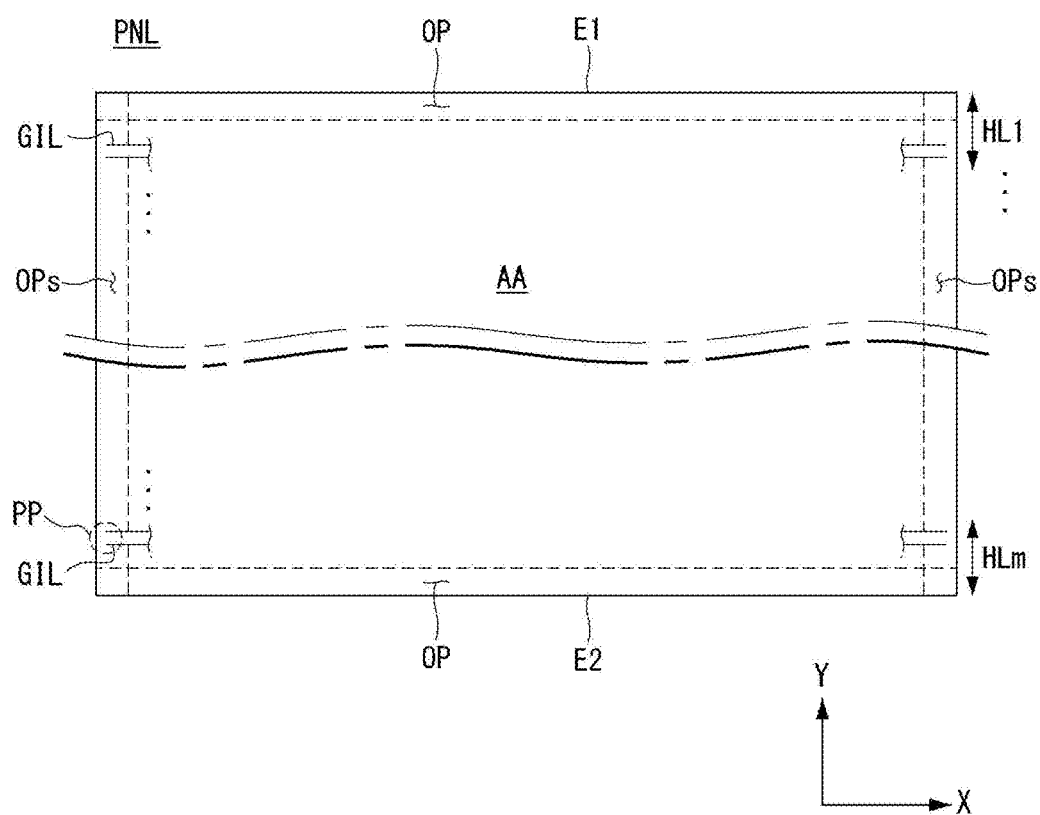
FIG. 14 is a plan view schematically illustrating a display panel according to another embodiment of the present disclosure.

FIG. 14 is a plan view schematically illustrating a display panel according to another embodiment of the present disclosure.

Referring to FIG. 14, the display panel may further include an additional open portion OPs in addition to the open portion OP. The additional open portion OPs are provided by removing at least one of the planarization layer OC and the bank layer BN, and may be substantially the same as the open portion OP. Therefore, according to the preferred embodiment of the present disclosure, the additional open portion Ops are further provided in the peripheral area to more effectively block the inflow path of moisture, whereby there is an advantage of preventing degradation of the light emitting element due to moisture penetration.

As described through FIGS. 6 to 11, the open portion OP may be defined at one end and the other end of the active area AA in the second direction. As described above, the GIP lines GILs extending in the first direction are not disposed in the open portion OP.

In addition, as illustrated in FIG. 14, the additional open portion OPs may be defined at one end and the other end of the active area AA in the first direction. When the GIP lines GILs extending in the first direction are located in the open portion OP extending in the first direction, since an overlapping area with the cathode in the corresponding area is large and the parasitic capacity is large, the effect of the parasitic capacity may be significant. However, when the GIP lines GIL are located in the additional open portion OP, only one part PP of the GIP line GIL extending in the first direction is located in the additional open portion Ops extending in the second direction Ops, whereby the overlap area with the cathode is relatively small. Therefore, since the parasitic capacity is relatively small so that the effect of the parasitic capacity is insignificant, even if a part PP of the GIP lines GIL is located in the additional open portion OPs, problems of a lighting failure of the pixel and a difference in luminance may not occur.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

The invention claimed is:
1. A display panel, comprising:
an active area including pixels arranged along a first direction and a second direction intersecting each other and data lines and gate lines arranged to be intersected; and
shift registers supplying a gate pulse to each of the gate lines,
wherein each of the shift registers includes:
GIP circuit portions dispersedly disposed in the active area; and
GIP lines supplying a predetermined signal to the GIP circuit portions or connecting the GIP circuit portions with each other, the GIP lines being located between neighboring pixels along the second direction,
wherein the active area includes a plurality of pixels arranged along the first direction and a plurality of pixel lines sequentially defined along the second direction; and
the GIP lines are located between a (2n−1)-th pixel line and a 2n-th pixel line, wherein n is a natural number greater than or equal to one, and
wherein the GIP lines include (2n−1)-th GIP lines and 2n-th GIP lines sequentially arranged along the second direction between the (2n−1)-th pixel line and the 2n-th pixel line that are neighboring along the second direction;
the (2n−1)-th GIP lines are connected to GIP circuit portions disposed in the (2n−1)-th pixel line;
the 2n-th GIP lines are connected to GIP circuit portions disposed in the 2n-th pixel line; and
the (2n−1)-th GIP lines and the 2n-th GIP lines are symmetrically arranged with respect to a virtual refer- ence line extending in the first direction between the (2n−1)-th pixel line and the 2n-th pixel line that are neighboring.

2. The display panel of claim 1, wherein the display panel includes:
a substrate;
TFTs disposed on the substrate;
an interlayer insulating film covering the TFTs;
a planarization film covering the interlayer insulating film;
an anode located on the planarization film and electrically connected to the corresponding TFT;
a bank layer having an opening exposing at least a part of the anode;
an organic compound layer located on the opening; and
a cathode located on the organic compound layer,
wherein at least one of the planarization layer and the bank layer is removed at one end and the other end in the second direction of the active area to form an open portion.

3. The display panel of claim 2, wherein the GIP line is not located in the open portion.

4. The display panel of claim 1, wherein the pixels include sub-pixels each including a light emitting element having an anode, a cathode, and an organic compound layer located between the anode and the cathode;
the active area includes an EVSS contact portion connecting the cathode and an EVSS line supplying a low potential pixel reference voltage to the cathode; and
the EVSS contact portion is selectively located between the 2n-th pixel line and the (2n+1)-th pixel line that are neighboring.

5. The display panel of claim 4, wherein the EVSS contact portion includes:
at least one insulating layer interposed between the EVSS line and the cathode; and
an EVSS contact hole passing through the at least one insulating layer to connect the EVSS line and the cathode.

6. A display panel, comprising:
an active area including pixels arranged along a first direction and a second direction intersecting each other and data lines and gate lines arranged to be intersected; and
shift registers supplying a gate pulse to each of the gate lines,
wherein each of the shift registers includes:
GIP circuit portions dispersedly disposed in the active area; and
GIP lines supplying a predetermined signal to the GIP circuit portions or connecting the GIP circuit portions with each other, the GIP lines being located between neighboring pixels along the second direction,
wherein the active area includes a plurality of pixels arranged along the first direction and a plurality of pixel lines sequentially defined along the second direction; and
the GIP lines are located between a (2n−1)-th pixel line and a 2n-th pixel line, wherein n is a natural number greater than or equal to one, and
wherein the GIP lines include a 1-1 GIP line, a 1-2 GIP line, a 2-2 GIP line and a 2-1 GIP line sequentially arranged along the second direction between the (2n−1)-th pixel line and the 2n-th pixel line that are neighboring;
the 1-1 GIP line and the 1-2 GIP line are connected to GIP circuit portions disposed in the (2n−1)-th pixel line;
the 2-2 GIP line and the 2-1 GIP line are connected to GIP circuit portions disposed in the 2n-th pixel line;
a same type of signal is applied to the 1-1 GIP line and the 2-1 GIP line; and
a same type of signal is applied to the 1-2 GIP line and the 2-2 GIP line.

7. The display panel of claim 6, wherein the signal applied to the 1-1 GIP line and the 2-1 GIP line is one of a clock and a power supply voltage; and
the signal applied to the 1-2 GIP line and the 2-2 GIP line is the other of the clock and the power supply voltage.

8. A display device, comprising:
a display panel including an active area including pixels arranged along a first direction and a second direction intersecting each other and data lines and gate lines arranged to be intersected;
a data driving circuit supplying data voltages to the data lines; and
a gate driving circuit sequentially supplying gate pulses to the gate lines,
wherein the gate driving circuit includes shift registers that supply a gate pulse to the gate lines; and
each of the shift registers includes:
GIP circuit portions dispersedly distributed in the active area; and
GIP lines supplying a predetermined signal to the GIP circuit portions or connecting the GIP circuit portions to each other, the GIP lines being selectively located only between neighboring pixels along the second direction,
wherein the active area includes a plurality of pixels arranged along the first direction and a plurality of pixel lines sequentially defined along the second direction; and
the GIP lines are located between a (2n−1)-th pixel line and a 2n-th pixel line, wherein n is a natural number greater than or equal to one, and
wherein the GIP lines include (2n−1)-th GIP lines and 2n-th GIP lines sequentially arranged along the second direction between the (2n−1)-th pixel line and the 2n-th pixel line that are neighboring along the second direction;
the (2n−1)-th GIP lines are connected to GIP circuit portions disposed in the (2n−1)-th pixel line;
the 2n-th GIP lines are connected to GIP circuit portions disposed in the 2n-th pixel line; and
the (2n−1)-th GIP lines and the 2n-th GIP lines are symmetrically arranged with respect to a virtual reference line extending in the first direction between the (2n−1)-th pixel line and the 2n-th pixel line that are neighboring.

9. A display device, comprising:
a display panel including an active area including pixels arranged along a first direction and a second direction intersecting each other and data lines and gate lines arranged to be intersected;
a data driving circuit supplying data voltages to the data lines; and
a gate driving circuit sequentially supplying gate pulses to the gate lines,
wherein the gate driving circuit includes shift registers that supply a gate pulse to the gate lines; and
each of the shift registers includes:
GIP circuit portions dispersedly distributed in the active area; and
GIP lines supplying a predetermined signal to the GIP circuit portions or connecting the GIP circuit portions to each other, the GIP lines being selectively located only between neighboring pixels along the second direction, wherein the active area includes a plurality of pixels arranged along the first direction and a plurality of pixel lines sequentially defined along the second direction; and the GIP lines are located between a (2n−1)-th pixel line and a 2n-th pixel line, wherein n is a natural number greater than or equal to one, and wherein the GIP lines include a 1-1 GIP line, a 1-2 GIP line, a 2-2 GIP line and a 2-1 GIP line sequentially arranged along the second direction between the (2n−1)-th pixel line and the 2n-th pixel line that are neighboring;

the 1-1 GIP line and the 1-2 GIP line are connected to GIP circuit portions disposed in the (2n−1)-th pixel line;

the 2-2 GIP line and the 2-1 GIP line are connected to GIP circuit portions disposed in the 2n-th pixel line;

a same type of signal is applied to the 1-1 GIP line and the 2-1 GIP line; and a same type of signal is applied to the 1-2 GIP line and the 2-2 GIP line.

* * * * *